(12) United States Patent
Walzer et al.

(10) Patent No.: US 12,322,148 B1
(45) Date of Patent: Jun. 3, 2025

(54) APPARATUS AND METHODS FOR APPLYING FIDUCIAL MARKINGS

(71) Applicant: The Government of the United States of America, as represented by the Secretary of the Navy, Arlington, VA (US)

(72) Inventors: Eric R. Walzer, Washington, DC (US); Joseph R. Walther, Darnestown, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 423 days.

(21) Appl. No.: 17/546,592

(22) Filed: Dec. 9, 2021

(51) Int. Cl.
| | |
|---|---|
| *G06V 10/24* | (2022.01) |
| *B29C 64/141* | (2017.01) |
| *B29C 64/40* | (2017.01) |
| *B33Y 10/00* | (2015.01) |
| *B33Y 80/00* | (2015.01) |
| *G03F 7/00* | (2006.01) |
| *G06T 7/33* | (2017.01) |
| *G06T 7/73* | (2017.01) |

(52) U.S. Cl.
CPC .......... *G06V 10/245* (2022.01); *B29C 64/141* (2017.08); *B29C 64/40* (2017.08); *B33Y 10/00* (2014.12); *B33Y 80/00* (2014.12); *G03F 7/70216* (2013.01); *G06T 7/337* (2017.01); *G06T 7/74* (2017.01); *G06T 2207/30204* (2013.01)

(58) Field of Classification Search
CPC .... G06V 10/245; B29C 64/141; B29C 64/40; B33Y 10/00; B33Y 80/00; G06T 7/74; G06T 2207/30204; G03F 7/70216; B41K 3/00; B05D 1/28
See application file for complete search history.

(56) References Cited

U.S. PATENT DOCUMENTS

| | | | |
|---|---|---|---|
| 7,875,837 B1 | 1/2011 | Szabo | |
| 7,965,868 B2 | 6/2011 | Roberts | |
| 8,550,346 B2 | 10/2013 | Liu | |
| 8,864,400 B1 * | 10/2014 | Schumaier | B43K 23/001 401/266 |
| 9,911,046 B1 * | 3/2018 | Yakimenko | G06V 10/44 |
| 11,624,825 B2 | 4/2023 | Mellor | |
| 11,676,312 B2 | 6/2023 | Okur | |

* cited by examiner

*Primary Examiner* — Alison L Hindenlang
*Assistant Examiner* — Shibin Liang
(74) *Attorney, Agent, or Firm* — Dawn C. Russell; Jesus J. Hernandez

(57) ABSTRACT

Fiducial marking apparatus are provided, which include an outer wall customized to receive an object to be provided with fiducial markings, for example, a projectile being subjected to ballistic testing. The fiducial marking apparatus includes openings in the outer wall, which are used to apply fiducial markings to the object provided therein. Fiducial marking apparatus may be customized for marking of different objects. Methods for forming fiducial marking apparatus and methods for applying fiducial markings to objects using the fiducial marking apparatus are also provided.

13 Claims, 5 Drawing Sheets

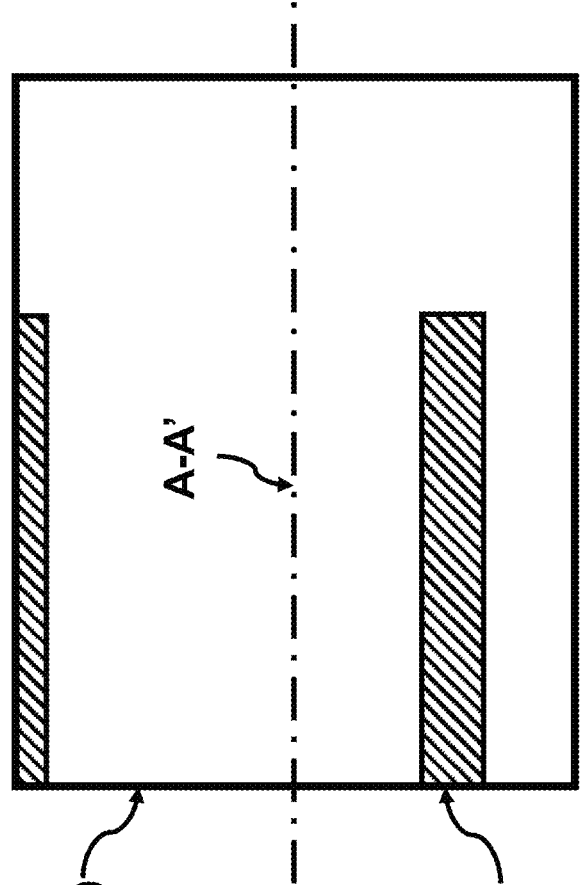
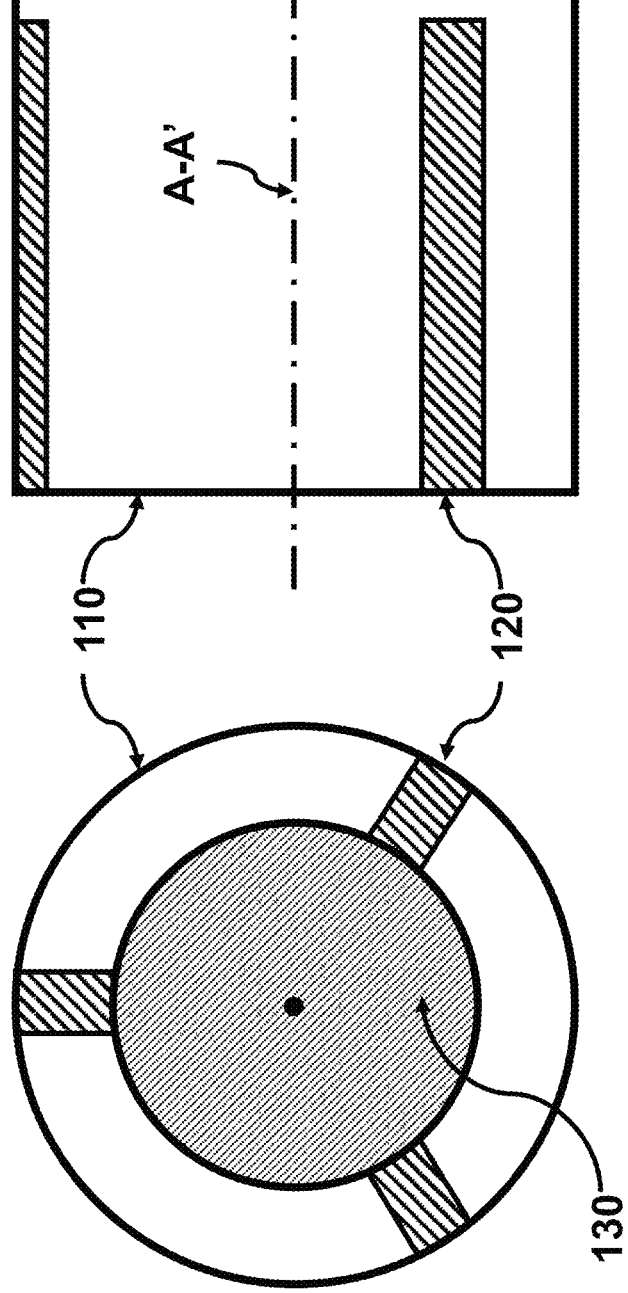

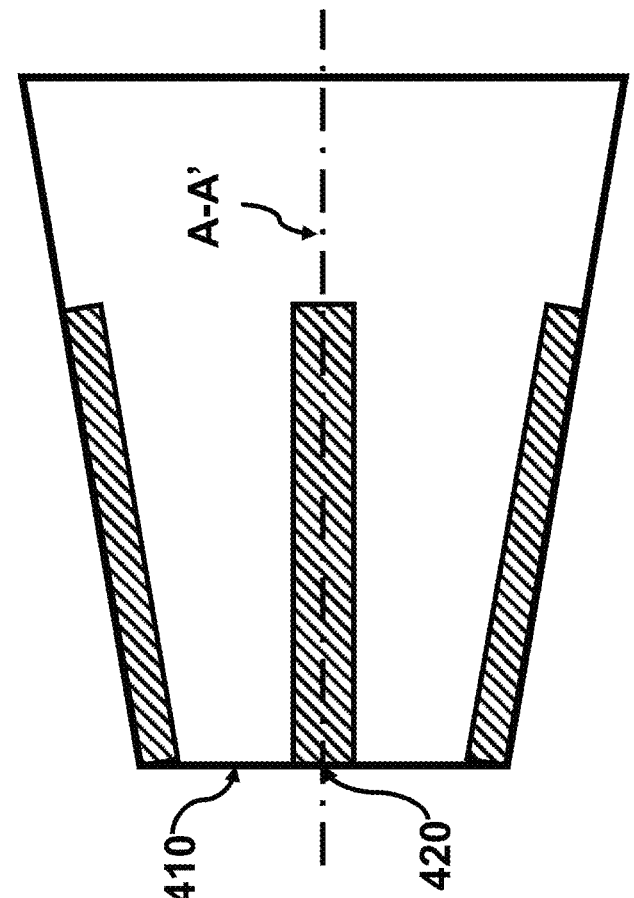
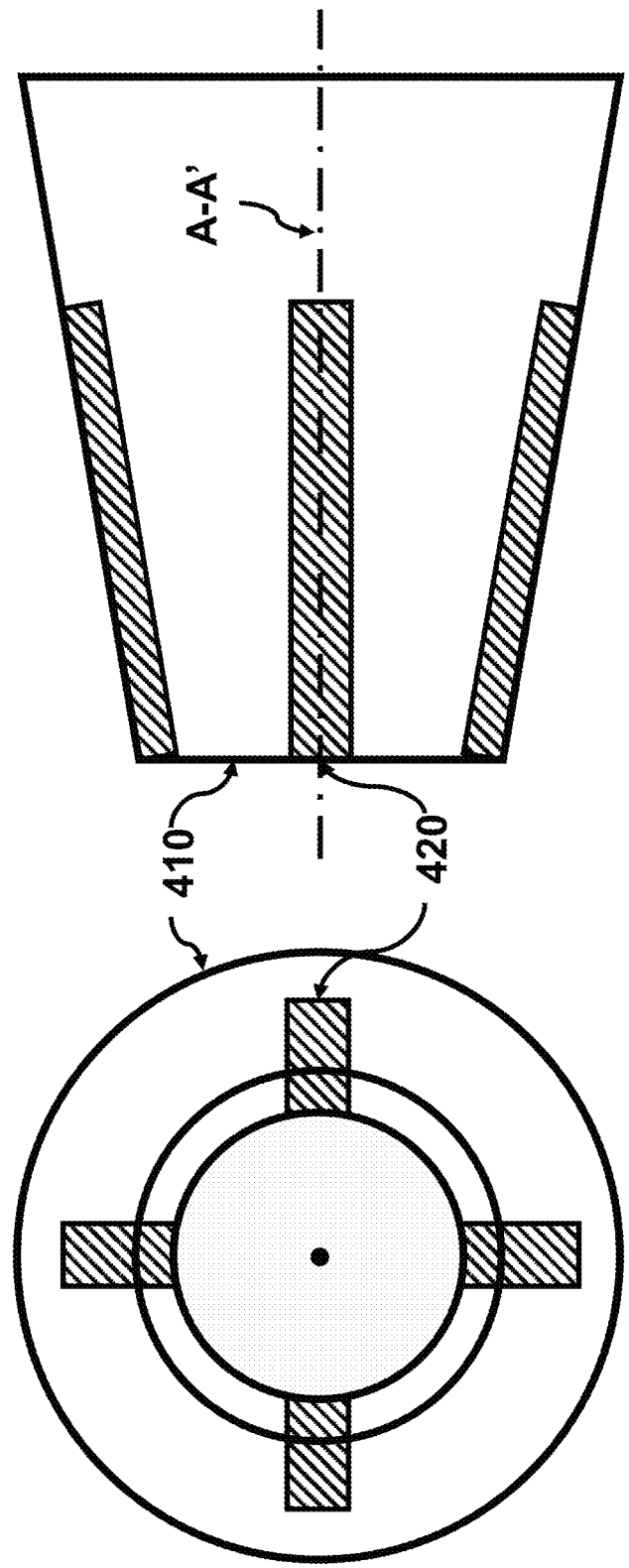

APPARATUS AND METHODS FOR APPLYING FIDUCIAL MARKINGS

FIELD OF THE INVENTION

Fiducial marking apparatus are provided, which include an outer wall customized to receive an object to be provided with fiducial markings, for example, a bullet being subjected to ballistic testing. The fiducial marking apparatus includes openings in the outer wall, which are used to apply fiducial markings to an object provided therein. Fiducial marking apparatus may be customized for marking of different objects. Methods for forming fiducial marking apparatus and methods for applying fiducial markings to objects using the fiducial marking apparatus are also provided.

BACKGROUND OF THE INVENTION

Fiducial markings are applied to projectiles to permit them to be tracked accurately, for example, when conducting ballistic testing.

Existing methods for creating fiducial markings on projectiles include hand drawing lines using rulers or similar devices. This method is limited in accuracy and reproducibility, and does not allow for detailed placement of markings on curved projectiles.

Additional methods exist in which tape is used to guide fiducial markings. However, this method does not allow for placement of markings at precise radial angles around the projectile. It also suffers from the drawbacks of being slow and cumbersome.

Precise radial angle placements are needed to obtain detailed measurements during ballistic testing. The previous methods are limited in the shape of the projectiles that can be marked, particularly irregular shapes such as fragments from warheads.

A need exists in the art for alternatives to traditional techniques for providing fiducial markings on projectiles, particularly complex markings.

SUMMARY OF THE INVENTION

The apparatus and methods of the invention address a need to provide reproducible fiducial markings in a variety of configurations, which may be used, for example, in ballistic testing. The invention may also be used to provide methods for applying fiducial markings accurately and reproducibly to projectiles having a variety of shapes.

Fiducial marking apparatus of the invention include an outer wall customized to receive an object to be provided with fiducial markings, for example, a bullet being subjected to ballistic testing. The fiducial marking apparatus includes openings in the outer wall, which are used to apply fiducial markings to the object as it is held within the apparatus. Fiducial marking apparatus may be customized for marking of different objects.

In a first aspect of the invention, fiducial marking apparatus are provided. The apparatus include a perimeter wall configured to receive an object to be marked with fiducial markings, where the perimeter wall has portions of material removed therefrom, the removed portions forming a template for fiducial markings to be applied to an object positioned within the perimeter wall. The apparatus may optionally be formed using additive manufacturing techniques.

In an additional aspect of the invention, methods for making a fiducial marking apparatus for projectiles are provided. The methods include selecting a projectile to be marked; identifying a fiducial marking pattern to be applied to the projectile; and making a fiducial marking apparatus for the projectile, the fiducial marking apparatus including side walls configured to hold the projectile; and voids in the side walls corresponding to the fiducial markings to be applied to the projectile. The apparatus may optionally be formed by scanning the projectile to create a digital three-dimensional map of the projectile, and creating a digital blueprint of the apparatus for use as an additive manufacturing template.

A further aspect of the invention provides methods for providing reproducible fiducial markings on projectiles. The methods include identifying a projectile to be provided with fiducial markings; identifying fiducial markings to be applied to the projectile; placing the projectile in a fiducial marking apparatus having side walls configured to hold the projectile and voids in the side walls corresponding to the fiducial markings to be applied to the projectile; and applying fiducial markings to the projectile by directing marking agent through the voids in the side walls of the fiducial marking apparatus onto the projectile. The marking agent adheres to the projectile, forming a projectile having fiducial markings thereon.

Other features and advantages of the present invention will become apparent to those skilled in the art upon examination of the following or upon learning by practice of the invention.

BRIEF DESCRIPTION OF THE DRAWINGS

FIGS. 1A and 1B are top and side views of a fiducial marking apparatus of the invention. Straight fiducial markings are applied when using the apparatus.

FIGS. 4A and 4B are top and side views of a still another fiducial marking apparatus of the invention. The outer wall is angled at approximately 75° toward a central axis to form a conical apparatus. Straight fiducial markings may be applied using the apparatus.

DETAILED DESCRIPTION OF THE INVENTION

Figure 2B:
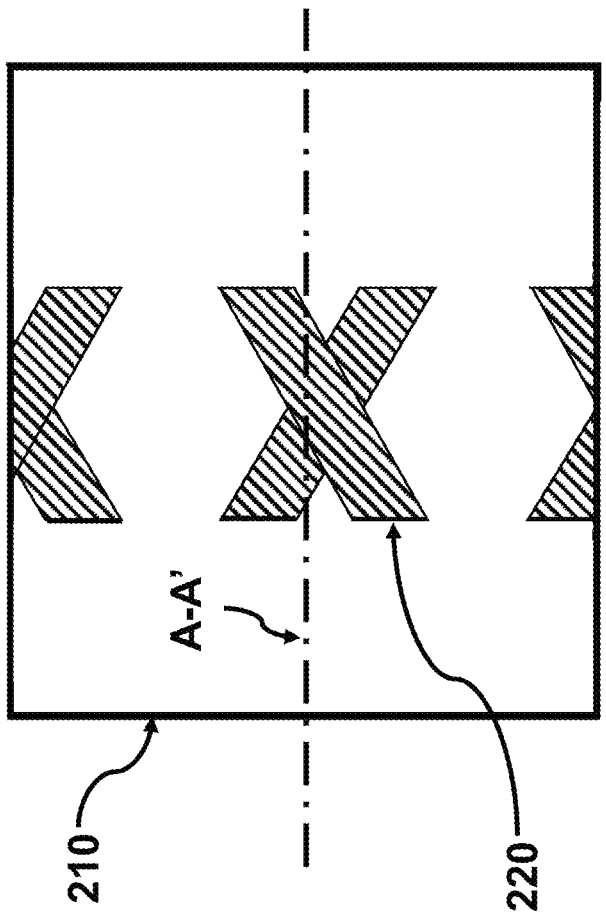
FIGS. 2A and 2B are top and side views of another fiducial marking apparatus of the invention. Cross-shaped or diagonal fiducial markings are applied when using the apparatus.

The inventions described herein provide fiducial marking apparatus, which include an outer wall customized to receive an object to be provided with fiducial markings, for example, a bullet being subjected to ballistic testing. The fiducial marking apparatus includes openings in the outer wall, which are used to apply fiducial markings to an object provided therein. The fiducial marking apparatus may be customized for marking of different objects. Methods for forming fiducial marking apparatus and methods for applying fiducial markings to objects using the fiducial marking apparatus are also provided The fiducial marking apparatus are used in methods for making accurate, reproducible markings on objects. Precision and repeatability in applying fiducial markings is a particular benefit of the methods and apparatus of the invention, and is especially valuable when tracking articles having complex shapes. The fiducial marking apparatus may be formed based on the object to be tracked, for example, using additive manufacturing materials and processes.

The apparatus and methods of the invention provide improved accuracy in placing fiducial markings on objects (particularly irregularly-shaped projectiles), and improved reproducibility of fiducial markings applied to multiple objects of the same type.

The fiducial markings applied using the apparatus of the invention may be used, for example, to support accurate measurement of roll angle of projectiles when fired from rifled barrels. This is particularly useful when projectiles are viewed using high speed videography during testing.

The apparatus and methods of the invention are not limited to use in connection to ballistic testing of projectiles from firearms. Fiducial markings applied using the apparatus and methods of the invention may be used to track a variety of types of movements. For example, fiducial markings may be applied to arrows or sports equipment (such as balls) to facilitate tracking their movements. They may also be applied to wheels of any kind, for example, to track the number of rotations the wheel makes in a given time period. Fiducial markings may also be applied to articles that are subjected to vibration, such as objects located in engine rooms, and payloads on rockets. Further, providing accurate markings on complex objects could be useful in machining applications.

Apparatus.

The fiducial marking apparatus of the invention preferably include an outer wall (i.e., peripheral wall or side walls) having sections of material removed therefrom, where the removed sections form a template for application of fiducial markings to an object positioned within the outer wall.

The outer wall of the fiducial marking apparatus can be of any shape. When the fiducial marking apparatus has a cylindrical outer wall, it may have sections of material removed from the outer wall at desired radial positions, such as two, three, four, five, six or more of 0, 45, 60, 72, 90, 120, 135, 144, 180, 216, 225, 240, 270, 288, 300, and 315 degrees, to allow for fiducial lines to be applied onto the projectile through the outer wall of the apparatus with a marking material, such as paint, or marker.

The invention is not limited to cylindrical outer walls, though they may be preferred in accordance with some aspects of the invention. The apparatus of the invention may have an outer wall of any configuration, where the inner surface of the outer wall is preferably matched to an outer surface geometry of an object to be marked with fiducial markings. For example, the fiducial marking apparatus of the invention can be configured to mark a unique, irregularly shaped object, such as a piece of shrapnel, bomb fragment, or warhead casing fragment. Likewise, the fiducial marking apparatus of the invention can be configured to mark multiple identical objects having known dimensions, such as bullets corresponding to a particular type of ammunition (for example, without limitation, 9 mm, 0.22 LR, .308 Winchester, .38 Special, .357 Magnum).

The invention is also not limited to any particular number, size, shape, or spacing of sections of removed material. The sections of removed material form openings in the fiducial marking apparatus that are used to apply corresponding fiducial markings to an object, such as a projectile. The openings can have any shape that permits application of a fiducial marking to the object, including, but not limited to, straight lines, helixes, curves, spots, Xs, grids or any other mark that results in application of one or more detectable fiducial marks or a pattern of fiducial marks on an object.

One example of a fiducial marking apparatus of the invention is an axisymmetric fiducial marking apparatus having an outer wall with an inner surface matched to an axisymmetric object (such as a bullet). The axisymmetric device may have rectangular openings provided in the outer wall, allowing straight fiducial lines to be drawn onto the object using any marking medium capable of applying a marking that can be detected. Marking media that are suitable for use in accordance with the invention include paints and dyes. The marking may be applied using any suitable technique, such as marker, paint brush, spray paint, or airbrush. Once applied to the object, the marking may be visible to the unaided human eye, or it may be visible only using ultraviolet or infrared detection methods.

Examples of the fiducial marking apparatus in accordance with the invention are shown in the accompanying drawings.

As shown in FIGS. 1A and 1B, in some embodiments, the fiducial marking apparatus of the invention may have substantially cylindrical side wall 110 with three rectangular openings 120 oriented parallel to a central axis A-A'. The openings 120 are spaced at 120° intervals around the side wall, and are used to apply fiducial markings to a projectile (not shown) that slides into the apparatus. A solid end 130 may be provided at one side of the cylindrical side wall 110 to prevent the projectile from sliding out of the apparatus during the marking process.

Figure 2A:
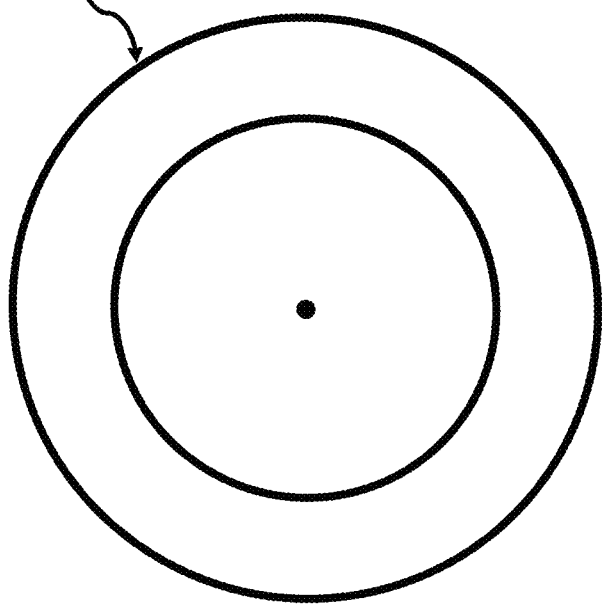

FIGS. 2A and 2B depict a fiducial marking apparatus of the invention in which substantially cylindrical side wall 210 has cross-hatch openings 220 for applying cross-hatch or slanted fiducial markings to a projectile (not shown) that slides into the apparatus. There is no solid end portion, so the projectile can slide in and out through both ends of the apparatus.

Figure 3B:
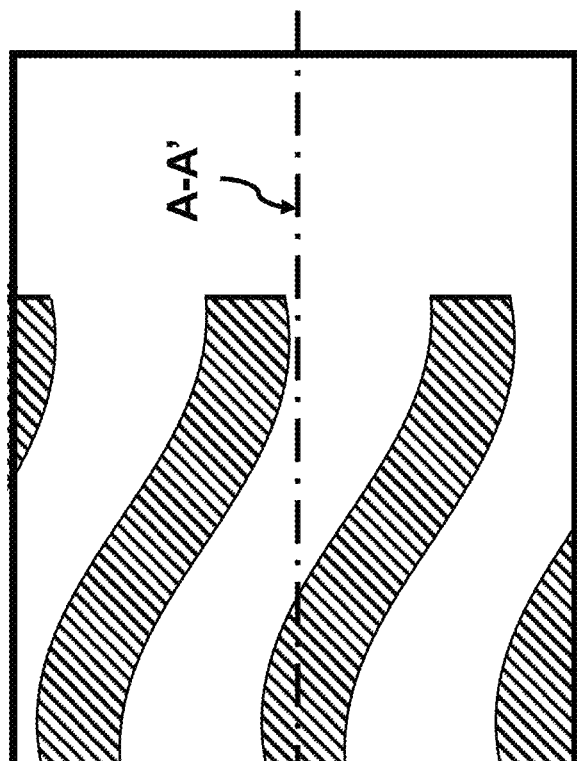
FIGS. 3A and 3B are top and side views of a further fiducial marking apparatus of the invention. Helical fiducial markings may be applied using the apparatus.
Figure 3A:
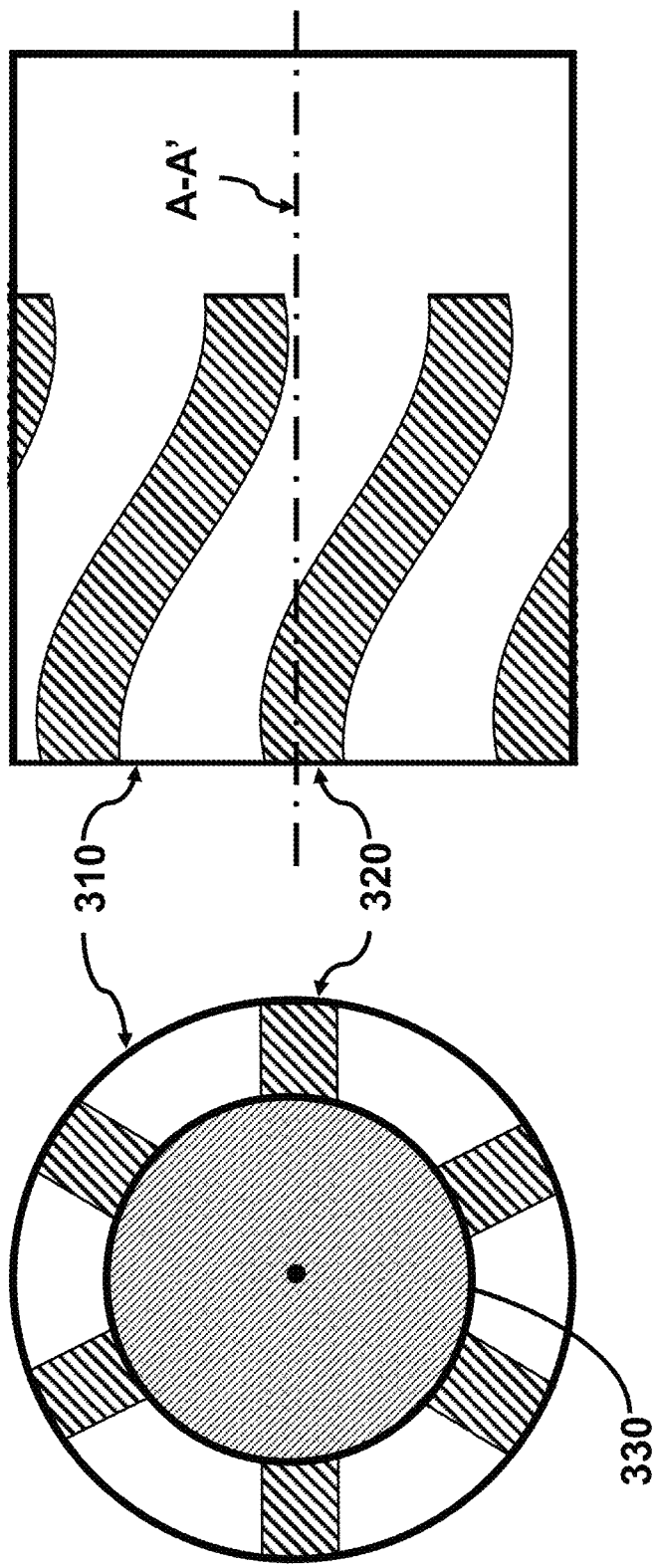

FIGS. 3A and 3B depict a fiducial marking apparatus having a substantially cylindrical side wall 310, with six openings 320 having a helical shape. The openings 320 are spaced at 60° intervals around the side wall. A solid end 330 supports the object within the apparatus during marking.

FIGS. 4A and 4B depict a fiducial marking apparatus of the invention that does not include a cylindrical side wall. Side wall 410 has a conical shape, which may correspond to the shape of a projectile to be marked with fiducial markings. Four openings 420 are provided in the side wall, at 90° intervals. No solid end portion is included, and a portion of the object may protrude from either or both ends of the apparatus during marking.

Figure 5A:
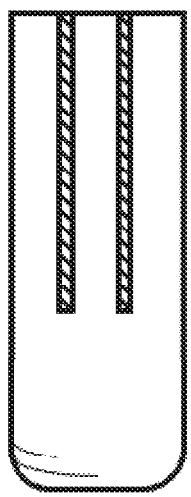
FIGS. 5A-5C are side views several fiducial marking apparatus of the invention.
Figure 5B:
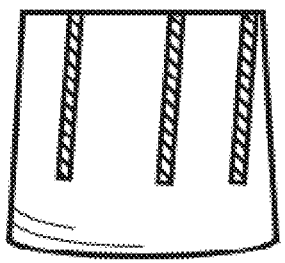
Figure 5C:
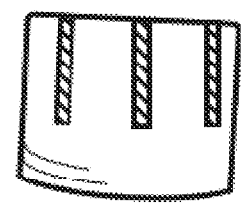
Figure 5D:
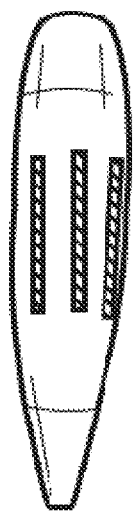
FIGS. 5D-5F are side views of projectiles to which fiducial markings have been applied using the apparatus of FIGS. 5A-5C.
Figure 5E:
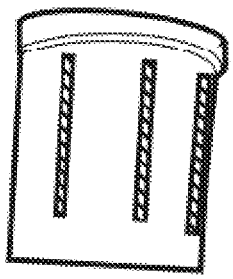
Figure 5F:
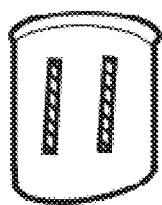

FIGS. 5A-5C depict fiducial marking apparatus that were customized for use in applying fiducial markings to the bullets and fragment simulating projectiles shown in FIGS. 5D-5F, which are depicted with markings applied by using the fiducial marking apparatus.

Regardless of the specific configuration of the fiducial marking apparatus, the invention allows for detailed placement of fiducial markings, which can be quickly and accurately applied. This beneficially results, for example, in improved ability to make detailed measurements of roll angle during ballistic testing.

An additional benefit provided by the invention include the ability to reproducibly apply fiducial markings having complex shapes to articles being tracked. This can permit measurements of movements beyond kinematics, such as deformation in the article. For example, when a square-shaped fiducial marking is applied to a spherical baseball, after the ball is hit, it is possible to calculate the deformation of the ball by tracking the degree to which the fiducial marking becomes "out of square".

The invention also beneficially provides the ability to repeatably and more safely mark articles formed using dangerous materials, such as radioactive materials. The apparatus limits the amount of contact required to accurately mark such articles.

Methods

The invention also provides methods for forming fiducial marking apparatus, and methods for applying fiducial markings to projectiles.

Methods for forming the fiducial marking apparatus of the invention are not particularly limited. In one presently-preferred embodiment, the fiducial marking apparatus of the invention can be customized to fit any projectile to be marked. First, the object or projectile to be marked may be scanned (for example, by digitizer, touch probe scanner, coordinate measuring machine, or laser scanner) to create a digitized version of the projectile. A digital blueprint for the fiducial marking apparatus is designed based on the digitized projectile, including an outer wall adapted to securely hold the projectile while the marking is applied, an optional solid base, and openings in the outer wall that correspond to fiducial markings to be applied to the projectile using the fiducial marking apparatus. Once the blueprint for the fiducial marking apparatus has been created based on the digitized model of the projectile, additive manufacturing (3-D printing) may be used to form the fiducial marking apparatus corresponding to the blueprint.

The additive manufacturing methods of the invention beneficially permit multiple adjustments to the blueprints and/or fiducial marking apparatus to be made to achieve a precise fit between the fiducial marking apparatus and the article to be marked. In some aspects of the invention, the methods for forming the fiducial marking apparatus of the invention may be iterative in nature. For example, after forming an apparatus of the invention using additive manufacturing, the fit of the article to be marked within the apparatus may be checked, as well as the fiducial markings applied using the apparatus. If improvement in fit or markings is desired, the initial blueprint may be modified or adjusted to create a revised blueprint, and a new apparatus may be created by additive manufacturing using the revised blueprint. This process may be repeated as many times as desired to achieve a fiducial marking apparatus that is customized for the article to be marked. Exact drawings or blueprints for the apparatus are not required, and in some cases, no drawings or blueprints may be required at all, which is particularly beneficial where the article to be marked has a complex shape.

The fiducial marking apparatus can be formed from plastic, metal, ceramic, or any other material suitable for use in additive manufacturing. For example, in some aspects of the invention, a polymer selected from the group consisting of acrylonitrile butadiene styrene (ABS), polylactide (PLA), polycarbonate (PC), polyamide (Nylon), epoxy resin, and photopolymer resin may be used to form the fiducial marking apparatus. In other aspects of the invention, a metal selected from the group consisting of steel, titanium, and aluminum may be used to form the fiducial marking apparatus.

In additional embodiments of the invention, other manufacturing processes, such as creating physical molds based on projectiles to be marked, may be used to form the fiducial marking apparatus of the invention.

Regardless of the specific technique used to create the fiducial marking apparatus, it is prepared by forming a receptacle for holding the sample object, where the receptacle comprises side walls and voids in the side walls. The voids in the side walls correspond to the pattern for the fiducial markings to be applied to objects having the same exterior dimensions as the sample object.

Methods for applying fiducial markings to an object, such as a projectile, are also provided in accordance with the invention.

The methods for applying reproducible fiducial markings to objects include identifying a sample object to be provided with fiducial markings. The sample object is not particularly limited, and may have a regular shape (for example, an axisymmetric shape of a bullet), or an irregular shape (for example, a random shape of a piece of shrapnel).

Once the sample object has been identified, the fiducial markings to be applied to the projectile may be selected with specific goals in mind. The fiducial markings can be drawn in any shape and size that support desired data collection, at a desired level of accuracy, during ballistic testing.

For example, to calculate spin of a projectile with a high degree of accuracy, several markings may be provided around the periphery of an axisymmetric projectile at precise radial positions (e.g., 0°, 120°, and 240°; 0°, 90°, 180°, and 270°; 0°, 72°, 144°, 216°, and 288°; or 0°, 60°, 120°, 180°, 240°, and) 300°, where each marking is a straight line running at least about 50% of the length of the projectile (preferably at least about 60%, more preferably at least about 75% of the length of the projectile) to maximize the ability to detect the markings using techniques such as high-speed videography. Where irregular spin is anticipated due to the shape of the projectile, markings in the shape of circles may be applied to the projectile at regular intervals, for example, 1, 2, 3, or 4 markings.

Once the size, shape, and number of fiducial markings to be applied to the sample object has been determined, a fiducial marking apparatus can be formed using the methods for forming fiducial apparatus described above.

Regardless of the particular size, shape, or spacing of the markings to be placed on the object, the methods of the invention permit them to be applied in a reproducible manner to any object having the same exterior dimensions as the sample object used to form the fiducial marking apparatus. The methods for marking objects include placing the object in the corresponding fiducial marking apparatus, and applying fiducial markings to the projectile by applying a marking medium through the voids in the side walls of the fiducial marking apparatus. The marking agent adheres to the object, forming a projectile with fiducial markings provided thereon.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. Fiducial marking apparatus, comprising:
a perimeter wall defining an enclosure and configured to receive an object, the perimeter wall having an inner surface and an outer surface such that the object may be received in the inner surface of the enclosure;
a plurality of openings situated about the perimeter wall in precise radial positions at angular intervals, the plurality of openings defining a radial template of fiducial markings for the enclosure, the plurality of openings each having an elongated shape oriented parallel to a central axis of the fiducial marking apparatus,
wherein the plurality of openings in the perimeter wall are defined by portions of material removed from the perimeter wall, such that the plurality of openings extends from the inner surface and the outer surface,
wherein the perimeter wall is configured to receive a marking material from the outer surface and through the plurality of openings in order to apply the fiducial markings to the object when positioned within the enclosure, the fiducial markings conforming to the radial template,
wherein the fiducial markings comprise discrete lines defining a shape and situated in radial locations at a same plane about the object and corresponding to each of the plurality of openings in the template without turning the object.

2. The fiducial marking apparatus of claim 1, wherein the fiducial marking apparatus comprises an additive manufacturing material selected from a group comprising of metal, polymer, and combinations thereof.

3. The fiducial marking apparatus of claim 2, where the polymer is selected from a group comprising of acrylonitrile butadiene styrene (ABS), polylactide (PLA), polycarbonate (PC), polyamide (Nylon), epoxy resin, and photopolymer resin.

4. The fiducial marking apparatus of claim 2, where the metal is selected from a group comprising of steel, titanium, and aluminum.

5. The fiducial marking apparatus of claim 1, where the perimeter wall is cylindrical.

6. The fiducial marking apparatus of claim 1, further comprising a solid end portion at one end of the perimeter wall.

7. The fiducial marking apparatus of claim 1, wherein the marking material is selected from a group comprising of paint, dye, ink, adhesive, and combinations thereof.

8. The fiducial marking apparatus of claim 1, where the inner surface of the perimeter wall is configured to an outer surface geometry of the object to be marked with fiducial markings.

9. The fiducial marking apparatus of claim 1, where the object is an irregularly-shaped object selected from a group comprising of shrapnel, bomb fragments, and warhead casing fragments, such that the inner surface of the perimeter wall is configured to envelop the irregularly-shaped object.

10. The fiducial marking apparatus of claim 1, where the object is a bullet, such that the inner surface of the perimeter wall is configured to envelop the bullet.

11. The fiducial marking apparatus of claim 1, wherein the elongated shape for each of the plurality of the openings is a rectangular opening.

12. The fiducial marking apparatus of claim 1, wherein the elongated shape for each of the plurality of the openings is a cross-hatch opening.

13. The fiducial marking apparatus of claim 1, wherein the elongated shape for each of the plurality of the openings is a helical shape.

* * * * *